(12) United States Patent
Tatsumi et al.

(10) Patent No.: US 12,543,531 B2
(45) Date of Patent: Feb. 3, 2026

(54) SUBSTRATE FOR CARRYING WAFER

(71) Applicant: NTT, Inc., Tokyo (JP)

(72) Inventors: Shoko Tatsumi, Musashino (JP); Masahiro Nada, Musashino (JP); Yasuhiko Nakanishi, Musashino (JP)

(73) Assignee: NTT, Inc., Tokyo (JP)

( * ) Notice: Subject to any disclaimer, the term of this patent is extended or adjusted under 35 U.S.C. 154(b) by 319 days.

(21) Appl. No.: 18/255,037

(22) PCT Filed: Dec. 4, 2020

(86) PCT No.: PCT/JP2020/045274
§ 371 (c)(1),
(2) Date: May 30, 2023

(87) PCT Pub. No.: WO2022/118468
PCT Pub. Date: Jun. 9, 2022

(65) Prior Publication Data
US 2024/0096675 A1  Mar. 21, 2024

(51) Int. Cl.
*H01L 21/677* (2006.01)
*H01L 21/68* (2006.01)
*H01L 21/683* (2006.01)

(52) U.S. Cl.
CPC .......... *H01L 21/6773* (2013.01); *H01L 21/68* (2013.01); *H01L 21/6838* (2013.01)

(58) Field of Classification Search
CPC .. Y10S 414/135; H01L 21/68; H01L 21/6838

USPC ............... 211/41.18; 356/401; 269/21, 11
See application file for complete search history.

(56) References Cited

U.S. PATENT DOCUMENTS

| 3,949,295 | A | * | 4/1976 | Moorshead | ........... B25B 11/005 |
|---|---|---|---|---|---|
| | | | | | 269/21 |
| 4,861,162 | A | | 8/1989 | Ina | |
| 6,541,989 | B1 | * | 4/2003 | Norris | ............... G01R 31/2831 |
| | | | | | 324/754.03 |
| 10,213,842 | B2 | * | 2/2019 | Maynard | ................. B23B 25/06 |
| 2001/0055117 | A1 | | 12/2001 | Mizutani | |
| 2002/0054209 | A1 | | 5/2002 | Obi | |
| 2003/0133762 | A1 | | 7/2003 | Yamamoto et al. | |
| 2020/0073257 | A1 | * | 3/2020 | Mirin | .................... H01L 23/544 |

FOREIGN PATENT DOCUMENTS

| EP | 1675165 A2 * | 6/2006 | ........... G03F 9/7084 |
|---|---|---|---|
| JP | S61-263123 A | 1/1986 | |
| JP | 2000-147067 A | 5/2000 | |
| JP | 2001-332490 A | 11/2001 | |
| JP | 2002-151555 A | 5/2002 | |

(Continued)

*Primary Examiner* — Jason L Vaughan
(74) *Attorney, Agent, or Firm* — Workman Nydegger

(57) ABSTRACT

The present disclosure is to provide a wafer carrier substrate for carrying a wafer on which a plurality of chips is formed, elements to be measured being built in the plurality of chips. The wafer carrier substrate includes: a vacuuming hole for vacuuming of the wafer placed on the wafer carrier substrate; a wafer alignment guide for determining a predetermined position of the wafer placed on the wafer carrier substrate; and a mark for determining a probe contact position. It is possible to recognize a specific shot, without any additional processing of the semiconductor wafer.

12 Claims, 9 Drawing Sheets

(56) References Cited

FOREIGN PATENT DOCUMENTS

| JP | 2003-234392 | A | | 8/2003 | | |
|----|-------------|---|---|--------|---|---|
| JP | 2009-170730 | A | | 7/2009 | | |
| TW | 200917410 | A | * | 4/2009 | ........... | H01L 23/544 |

* cited by examiner

SUBSTRATE FOR CARRYING WAFER

TECHNICAL FIELD

The present disclosure relates to semiconductor wafer measurement, and more particularly, to a substrate for carrying a wafer that is used in semiconductor wafer measurement.

BACKGROUND ART

In a conventional semiconductor manufacturing operation, electrical measurement of elements formed on a semiconductor wafer is performed at the stage where all the processes related to semiconductor formation have been completed. In the electrical measurement, the semiconductor wafer is secured onto a chuck by vacuuming, and a probe is brought into contact with a desired pad. In cases where a large amount of measurement is performed, a method involving a probe card having multiple pins and an autoprober is widely used.

CITATION LIST

Patent Literature

Patent Literature 1: JP 2000-147067 A
Patent Literature 2: JP 2002-151555 A

SUMMARY OF INVENTION

A semiconductor wafer has an area in which element formation is defective in the semiconductor wafer particularly at an edge portion in processing. It is desirable to avoid measuring all areas including a defective area, because this will lead to a decrease in measurement throughput. Therefore, a method for accurately measuring only an effective area is necessary.

There also are cases where a defective area cannot be visually recognized in the process of element formation. FIG. 1 is a diagram illustrating a semiconductor wafer 10, a pattern 11 formed on the semiconductor wafer, and an effective area 12 (a white portion in a rectangle indicated by a bold line). Normally, completely identical patterns are formed in adjacent shots in element formation on a semiconductor wafer. In a case where there is not a mark for determining a probe contact position on a semiconductor wafer, it is necessary to determine a probe contact position through visual recognition. Since the entire semiconductor wafer cannot be viewed at once with an autoprober due to the limitation of angle of view of the camera, it is necessary to determine the probe contact position from a partial image.

FIG. 2(a) is a diagram illustrating a state in which the effective area 12 and a measurement area 13 (a dark shaded portion) of the pattern 11 formed on the semiconductor wafer coincide with each other. FIG. 2(b) is a diagram illustrating a state in which the effective area 12 and the measurement area 13 of the pattern 11 formed on the semiconductor wafer do not coincide with each other. It is desirable to perform measurement in the state illustrated in FIG. 2(a). However, in a case where the effective area 12 cannot be distinguished from an image of the measurement area, an event in which a portion that is not the effective area is measured might occur in the state illustrated in FIG. 2(b). In a case where an area different from the effective area is measured, there is a possibility of a decrease in measurement throughput due to remeasurement, or a decrease in manufacturing throughput or a defect after shipment due to erroneous determination.

Therefore, an alignment technique for determining a probe contact position at a desired position is necessary.

Patent Literature 1 suggests a method involving a guide pin for positioning. By this method, however, when an autoprober moves a chuck, the positioning pin is damaged, or a probe card is damaged by the positioning pin. Therefore, it is difficult to apply the method to a large-amount measurement system that uses an autoprober. Patent Literature 2 suggests a method for performing alignment by sensing shades with a camera. By this method, however, a specific shot cannot be distinguished from others in a case where identical patterns are arranged adjacent to each other, and therefore, additional processing becomes necessary. Forming shot identification numbers on a semiconductor wafer requires addition of a reticle, an exposure process, and the like, and greatly impairs manufacturing efficiency. Therefore, applying the method disclosed in Patent Literature 2 to a wafer having a small diameter such as an optical semiconductor causes a decrease in manufacturing throughput.

The present disclosure is made in view of such a problem, and aims to provide a substrate for carrying a wafer that is used in semiconductor wafer measurement, and enables recognition of a specific shot without any additional processing of the semiconductor wafer.

To achieve such an object, an embodiment of the present invention is a wafer carrier substrate for carrying a wafer on which a plurality of chips is formed, elements to be measured being built in the plurality of chips. The wafer carrier substrate includes: a vacuuming hole for vacuuming of the wafer placed on the wafer carrier substrate; a wafer alignment guide for determining a predetermined position of the wafer placed on the wafer carrier substrate; and a mark for determining a probe contact position.

As described above, according to an embodiment of the present invention, it is possible to recognize a specific shot, without any additional processing of a semiconductor wafer. Further, as measurement is performed with a semiconductor wafer carrier substrate according to an embodiment of the present invention, there is no need to directly touch a wafer, and the handling during operation is facilitated.

Since the alignment mark for determining a probe contact position is used to identify a shot, the alignment mark does not need to have an accuracy of several μm, and only visual recognition with a camera (a chuck camera) of a prober capturing a wafer is required. This can be achieved through simple processing.

According to the present disclosure, probe alignment can be more efficiently performed, especially on a semiconductor wafer that requires a carrier substrate, such as a semiconductor wafer after polishing. In a case where an element on a wafer is measured not only by an autoprober but also by a manual operation, it is also easy to identify a target shot.

DESCRIPTION OF EMBODIMENTS

Figure 1:
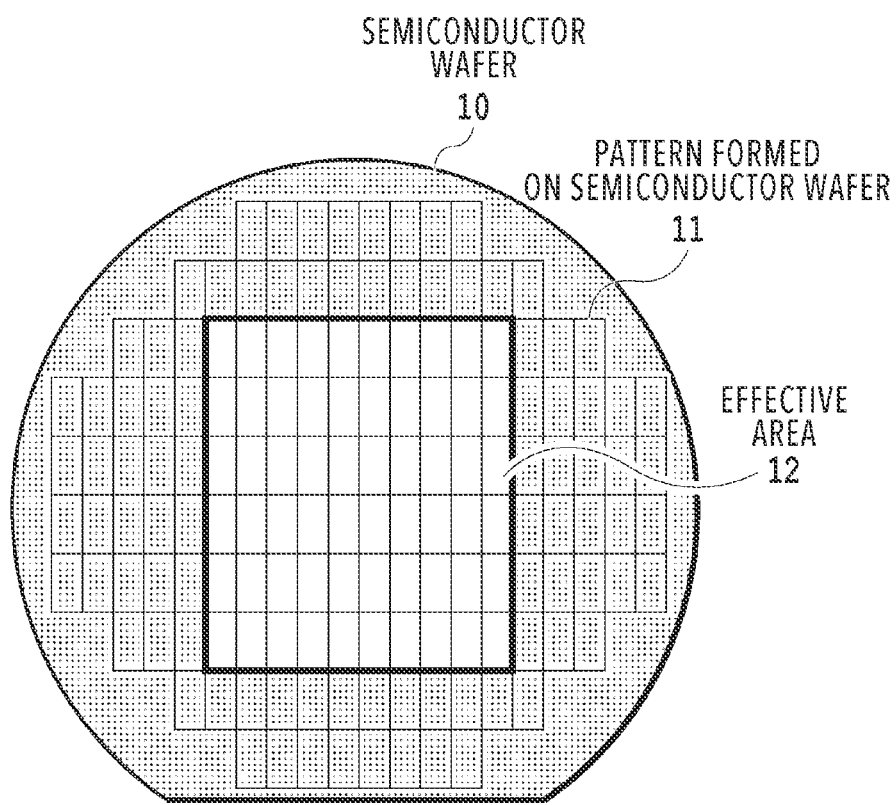
FIG. 1 is a diagram illustrating a semiconductor wafer, a pattern formed on the semiconductor wafer, and an effective area.
Figure 2:
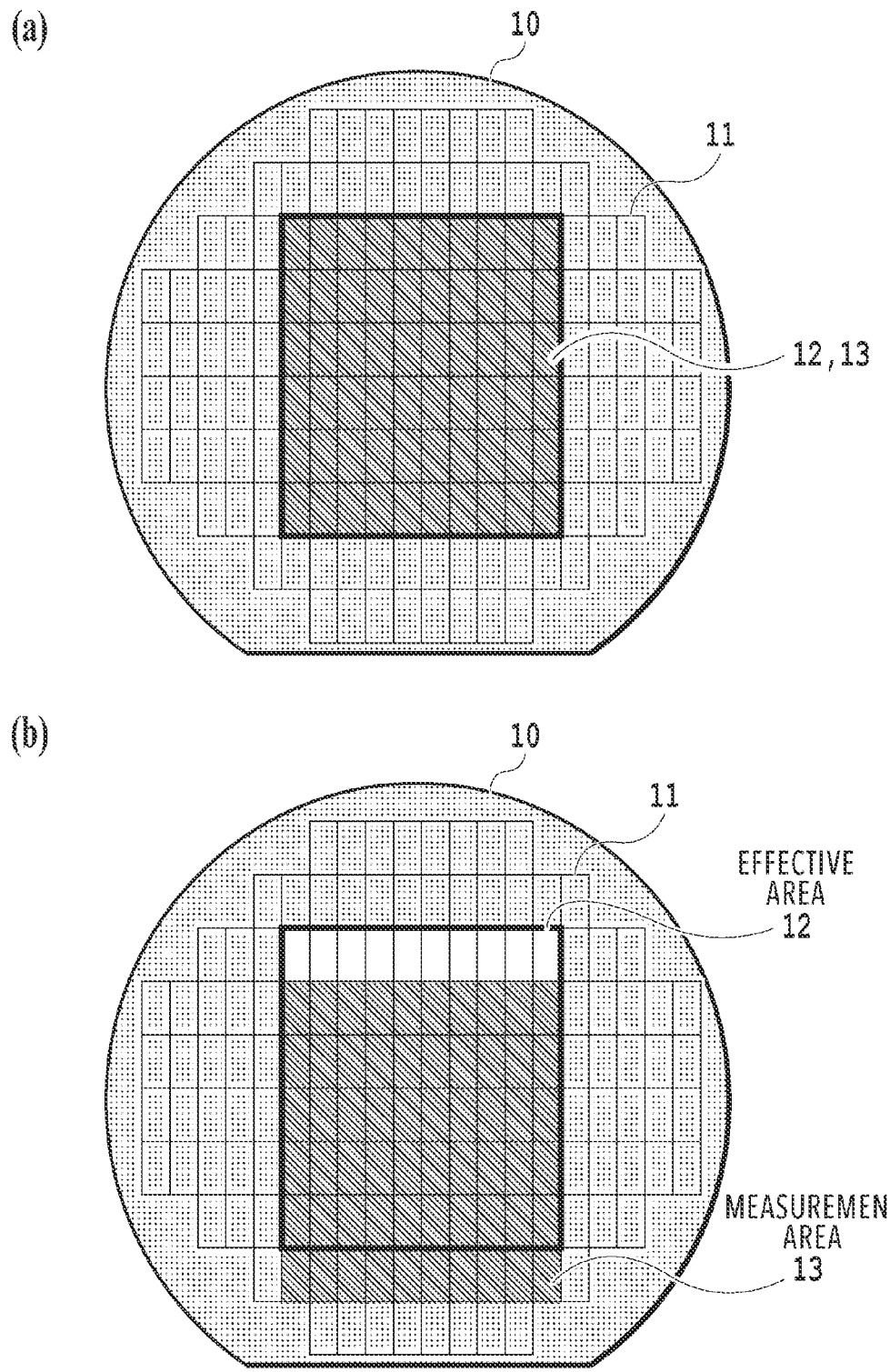
FIG. 2(a) is a diagram illustrating a state in which the effective area of a pattern formed on a semiconductor wafer and a measurement area coincide with each other.
FIG. 2(b) is a diagram illustrating a state in which the effective area of a pattern formed on a semiconductor wafer and a measurement area do not coincide with each other.

The following is a detailed description of embodiments of the present invention, with reference to the drawings. The same or similar reference numerals in the drawings denote the same or similar components, and repetitive explanation of them will not be made in some cases. Numerical values that are used in the following description of various embodiments are examples, and other numerical values may be used without departing from the scope of the present invention.

First Embodiment

Figure 3:
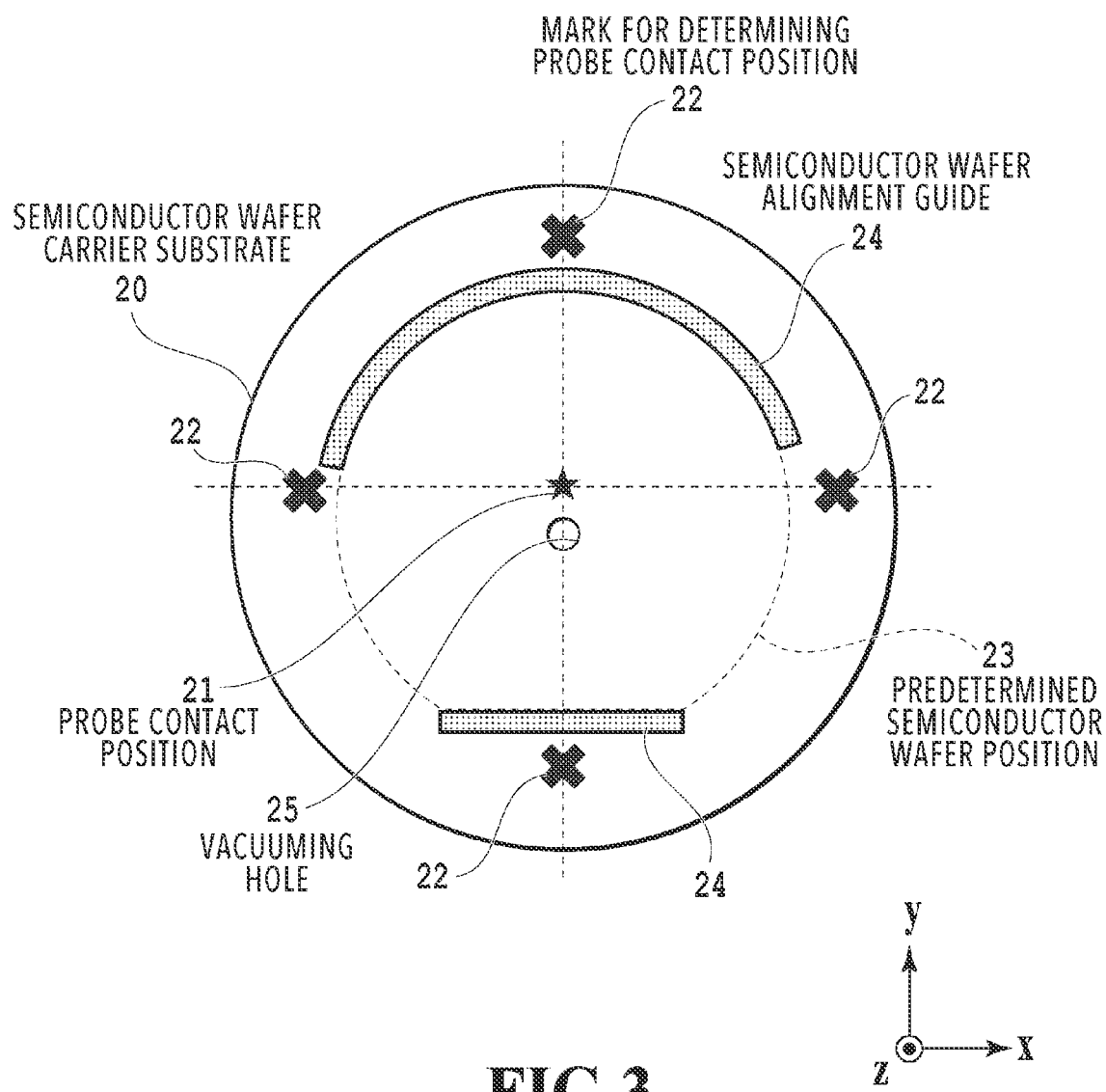
FIG. 3 is a diagram illustrating a semiconductor wafer carrier substrate according to an embodiment of the present invention.

FIG. 3 is a diagram illustrating a semiconductor wafer carrier substrate 20 according to this embodiment. As illustrated in FIG. 3, the semiconductor wafer carrier substrate 20 is used to place a semiconductor wafer at a predetermined semiconductor wafer position 23 and carry the semiconductor wafer. On the semiconductor wafer carrier substrate 20, marks 22 for determining a probe contact position are provided at four portions that are upper, lower, left, and right portions of the probe contact position 21, the four portions being located at positions in the rim, or at positions corresponding to the outer periphery of a semiconductor wafer to be placed on the substrate. The semiconductor wafer carrier substrate 20 includes semiconductor wafer alignment guides 24 at positions adjacent to at least part of the periphery of the predetermined semiconductor wafer position 23, and has at least one vacuuming hole 25 for securing the semiconductor wafer by vacuuming. The position of the vacuuming hole 25 is determined by the structure on the chuck side, and may not be located at the position corresponding to the center of the semiconductor wafer as long as vacuuming is structurally possible.

Relative positions of the semiconductor wafer and the marks 22 that determine a probe contact position and are formed on the semiconductor wafer carrier substrate 20 are determined by the semiconductor wafer alignment guides 24 for determining the predetermined semiconductor wafer position 23. When electrical measurement is performed, the semiconductor wafer carrier substrate 20 carrying a semiconductor wafer placed thereon is placed on a chuck of a prober in accordance with the semiconductor wafer alignment guides 24 on the semiconductor wafer carrier substrate 20, and the semiconductor wafer and the semiconductor wafer carrier substrate 20 are secured by vacuuming. At a time of alignment of the probe, the marks 22 for determining a probe contact position on the outer periphery of the placed semiconductor wafer are checked with a camera, and the probe can be brought into contact with the correct shot (which is a probe contact position 21 indicated by a black star) by an autoprober moving the probe a prescribed distance from the marks 22 for determining a probe contact position on the semiconductor wafer carrier substrate 20. After the movement to the shot, accurate probe contact with the measurement pad of a semiconductor element is performed by visual position adjustment from a composite image of the probe and the wafer. Therefore, the marks 22 for determining a probe contact position does not need to have an accuracy of several μm.

As illustrated in FIG. 3, if the marks 22 for determining a probe contact position are located at upper, lower, left, and right portions of the probe contact position 21 (black star), it is possible to check whether the alignment is correct, by aligning the probe with the probe contact position 21, and then moving the wafer to a position at which the marks 22 for determining a probe contact position can be visually recognized. In a case where alignment with a wrong position is performed, the marks for determining the probe contact position are not visible when the camera moves vertically and horizontally on the semiconductor wafer carrier substrate, and thus, the alignment error of the probe can be noticed.

In a case where measurement is performed with a probe card including a large number of probes, the probe to be aligned with the probe contact position 21 may be any needle in the needle group.

Figure 4:
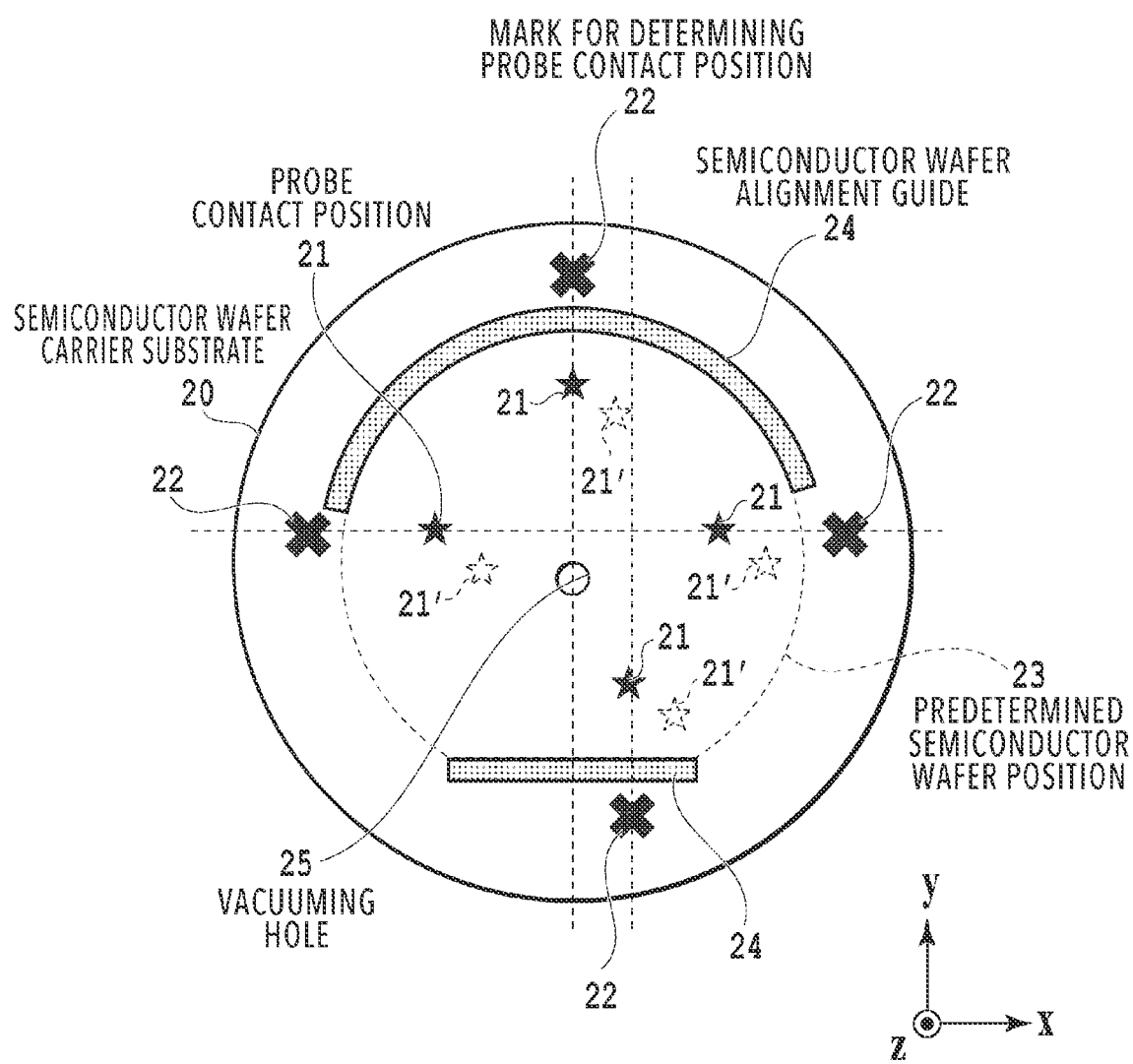
FIG. 4 is a diagram for explaining a method of bringing probes into contact with a plurality of probe contact positions on a semiconductor wafer placed on a semiconductor wafer carrier substrate according to an embodiment of the present invention.

Referring to FIG. 4, a method of bringing probes into contact with a plurality of desired positions (probe contact positions 21) on a semiconductor wafer placed on the semiconductor wafer carrier substrate 20 of this embodiment is described in the following. In this embodiment, the method is explained on the assumption that probes are to be simultaneously brought into contact with four desired elements on a semiconductor wafer. As illustrated in FIG. 4, probes are simultaneously brought into contact with elements at four desired positions on a semiconductor wafer. The probe card includes probes necessary for four elements. In a case where the semiconductor wafer or the semiconductor wafer carrier substrate 20 does not have any marks or spots (such as the marks 22 for determining probe contact positions), only part of the semiconductor wafer can be observed depending on the angle of view of the camera attached to the prober to be used. Therefore, it is difficult to identify the position of each of the four desired elements on the semiconductor wafer.

According to the semiconductor wafer carrier substrate 20 of this embodiment, the marks 22 for determining probe contact positions on the semiconductor wafer carrier substrate 20 is detected with the camera attached to the prober to be used first. The autoprober then moves a specified distance from the detected mark 22 for determining the probe contact position. As a result, the probes can be brought into contact with the correct shots. In a case where measurement of other four elements is to be performed after measurement of desired four elements is completed, it is possible to perform measurement of other desired four elements by moving the semiconductor wafer carrier substrate 20 having a semiconductor wafer placed thereon or the probes, using information (known information) about positions relative to any elements on the semiconductor wafer. For example, with the use of information (known information) about relative distances between elements at probe contact positions 21 indicated by black stars and elements at probe contact positions 21' indicated by stars drawn with dashed lines in FIG. 4, it is possible to measure the four elements at the probe contact positions 21, and then measure the four elements at the probe contact positions 21' indicated by the stars drawn with dashed lines, by moving the semiconductor wafer carrier substrate 20 having a semiconductor wafer placed thereon or the probes, without performing alignment again using the marks 22 for determining probe contact positions.

As described above, according to the semiconductor wafer carrier substrate 20 of this embodiment, probes can be easily brought into contact with a plurality of any desired elements on a semiconductor wafer, regardless of the prober to be used and the angle of view of the attached camera. As a result, more efficient probe alignment and measurement can be realized.

Also, if the semiconductor wafer carrier substrate 20 of this embodiment has a plurality of marks 22 for determining probe contact positions, the probe contact positions 21 can be designated for the respective marks of the plurality of marks 22 for determining probe contact positions. A method for performing measurement by individually bringing probes into contact with four desired elements on a semiconductor wafer is now described with reference to FIG. 4. In FIG. 4, the marks 22 for determining probe contact positions are prepared at positions each separated a predetermined distance in the x-axis direction or the y-axis direction from each corresponding one of the four probe contact positions 21, or at positions that are located on the rim of the semiconductor wafer carrier substrate 20 and correspond to the outer periphery of the semiconductor wafer to be placed. When probes are brought into contact, the probes are moved a predetermined distance (the x-axis direction or the y-axis direction) from the respective marks 22 for determining probe contact positions, so that the probes can be accurately brought into contact with different positions with respect to one semiconductor wafer. The distances between a plurality of probe contact positions 21 and the marks 22 for determining probe contact positions may be different from one another, as long as they are known in advance. As a result, probe alignment and measurement can be performed by designating a plurality of different elements for one semiconductor wafer, and thus, more efficient electrical measurement can be performed.

Second Embodiment

Next, marks 22 for determining a probe contact position are described with reference to FIGS. 5(*a*) and 5(*b*).

Figure 5:
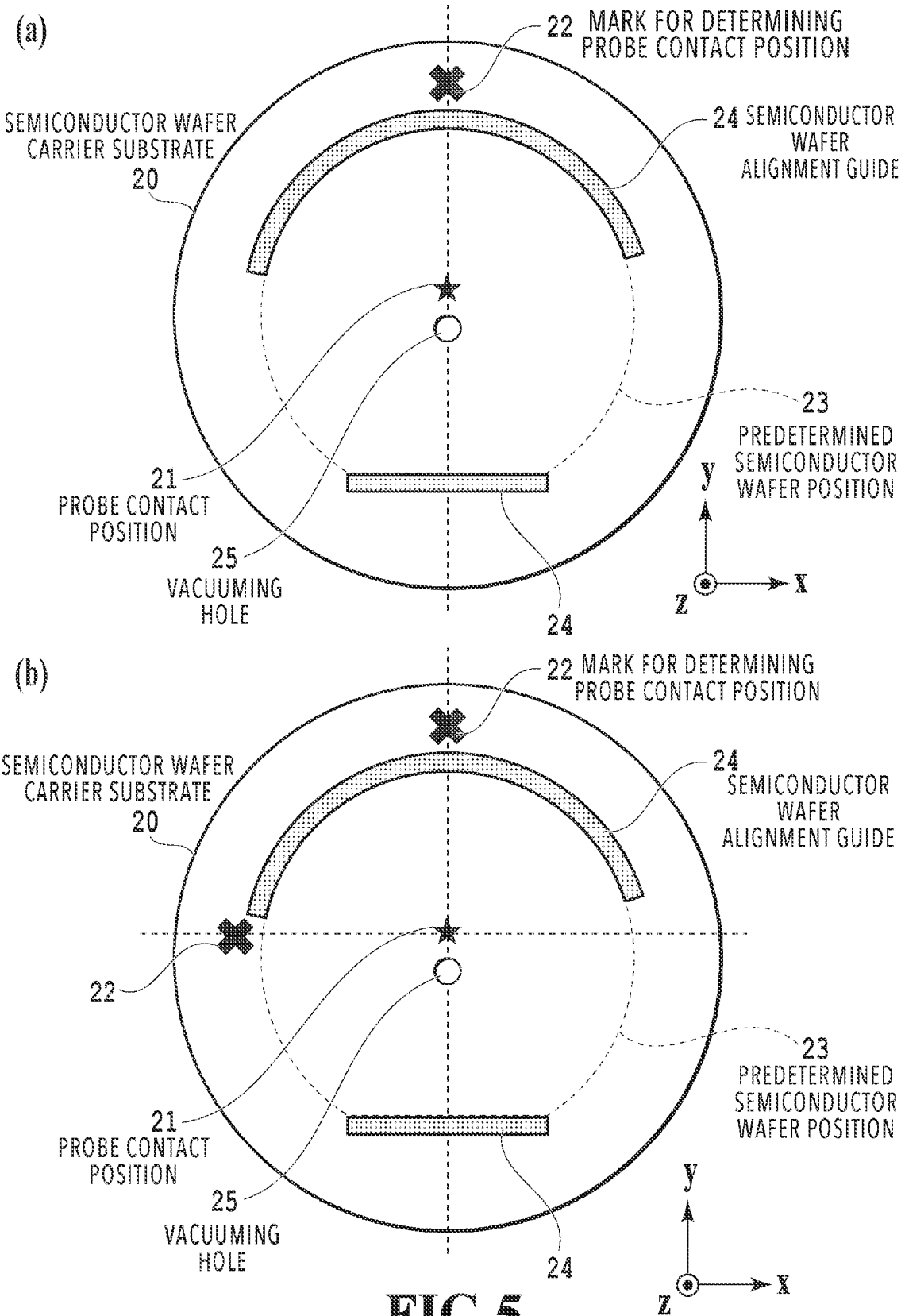
FIG. 5 is a diagram illustrating a semiconductor wafer carrier substrate according to an embodiment of the present invention.

FIGS. 5(*a*) and 5(*b*) are diagrams illustrating a semiconductor wafer carrier substrate 20 according to this embodiment. At positions in the rim portion of the semiconductor wafer carrier substrate 20, or at positions corresponding to the outer periphery of the semiconductor wafer to be placed on the substrate, marks 22 for determining a probe contact position are provided. The semiconductor wafer carrier substrate 20 includes semiconductor wafer alignment guides 24 at positions adjacent to at least part of the periphery of a predetermined semiconductor wafer position 23, and has at least one vacuuming hole 25 for securing the semiconductor wafer by vacuuming. Relative positions of the semiconductor wafer and the marks 22 that determines a probe contact position and is formed on the semiconductor wafer carrier substrate 20 are determined by the semiconductor wafer alignment guides 24 that are marks for determining a predetermined semiconductor wafer position.

If a function of moving an autoprober a predetermined distance is used, there may be only one mark 22 for determining a probe contact position, as illustrated in FIG. 5(*a*). For example, a y-direction distance from the mark 22 for determining a probe contact position to a desired shot (a probe contact position 21) is checked in advance. In a rim portion of the semiconductor wafer carrier substrate 20, or at a position above or below the semiconductor wafer to be placed thereon, an alignment mark (the mark 22 for determining a probe contact position) indicating an x-axis position of the desired shot in the semiconductor wafer is prepared. A probe is moved in the y-axis direction by the amount equivalent to the distance checked from the x-axis position of the desired shot indicated by the mark 22 for determining a probe contact position, and thus, the probe can be brought into contact with the desired shot. By this method, however after the probe is moved, it is not possible to check whether the probe has come to the correct y-axis position, using the mark 22 for determining a probe contact position on the semiconductor wafer carrier substrate. That is, it is difficult to notice an input error of the amount of movement of the probe in the y-axis direction.

Therefore, as illustrated in FIG. 5(*b*), at least one mark 22 for determining a probe contact position in the x-axis direction of the probe contact position is prepared at a position above or below the semiconductor wafer to be placed, and at least one mark 22 for determining a probe contact position in the y-axis direction of the probe contact position is prepared at a position to the right or left of the semiconductor wafer to be placed. After a probe is aligned with the probe contact position 21, the probe is moved in the x-axis direction and the y-axis direction with a chuck camera (an image in the x-axis direction and an image in the y-axis direction are obtained with the chuck camera), and the relative positions of the marks 22 (the x-axis direction and the y-axis direction) for determining a probe contact position and the probe contact position 21 are checked again. Thus, it is possible to check whether the probe is aligned with the correct shot.

Since the marks 22 for determining a probe contact position only needs to identify a shot, any mark having a smaller size than the shot size can function as a mark. The shot size greatly varies depending on the device to be manufactured. However, any mark that is 1 mm or shorter in both length and width can serve as a mark for identifying a shot. In view of visual observation with a camera (visual observation through an image acquired with a camera), a mark whose size is too small is unsuitable for practical use. Therefore, the size of the marks 22 for determining a probe contact position is preferably 100 μm or greater in both length and width.

With the semiconductor wafer carrier substrate 20 of this embodiment, it is possible to accurately move a probe and bring the probe into contact with a target shot. Also, after probe alignment, it is possible to check whether the alignment has been accurately performed, by visual recognition.

Third Embodiment

Figure 6:
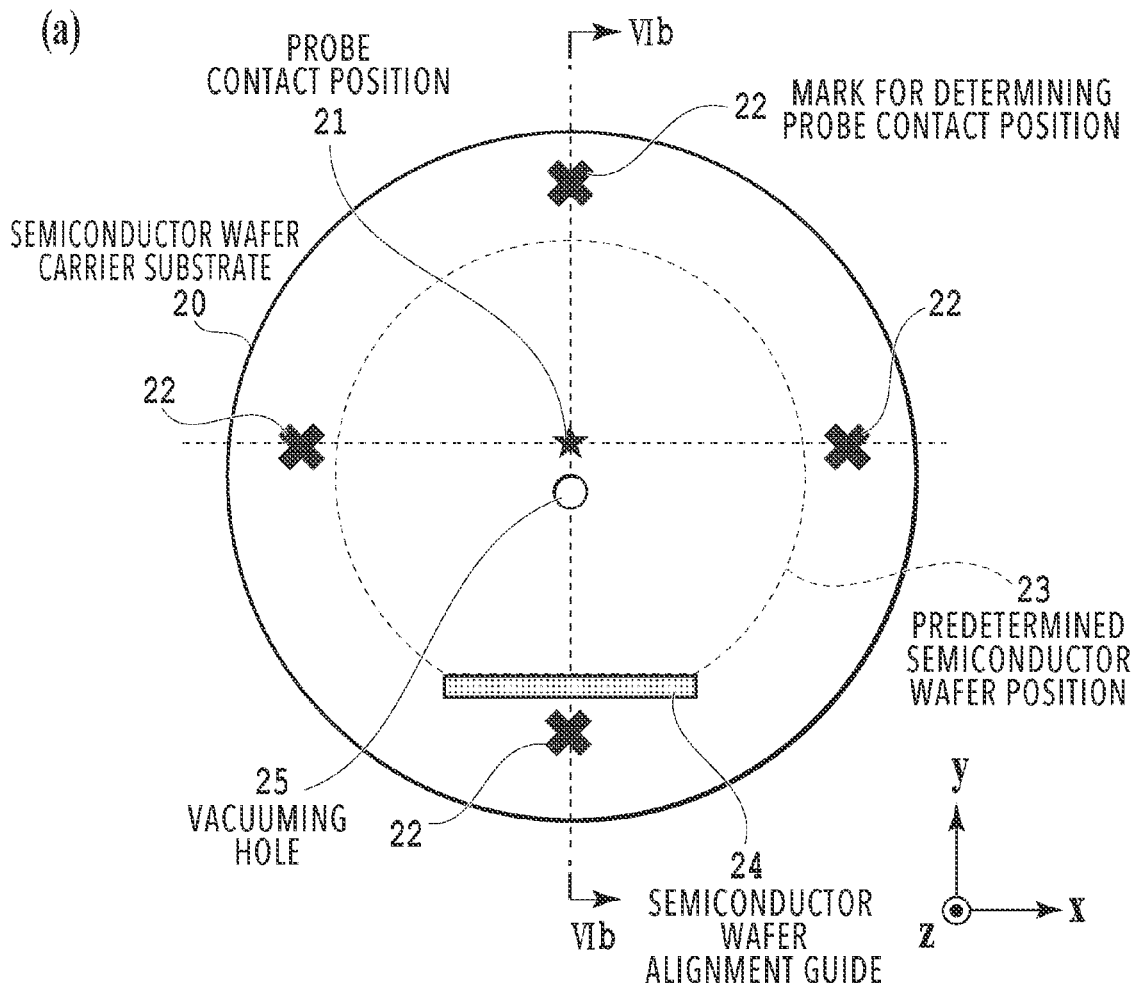
FIG. 6(a) is a diagram illustrating a semiconductor wafer carrier substrate according to an embodiment of the present invention.
FIG. 6(b) is a cross-sectional view taken along the section line VIb-VIb in FIG. 6(a), and is a diagram illustrating a conductor wafer alignment guide according to an embodiment.
Figure 6:
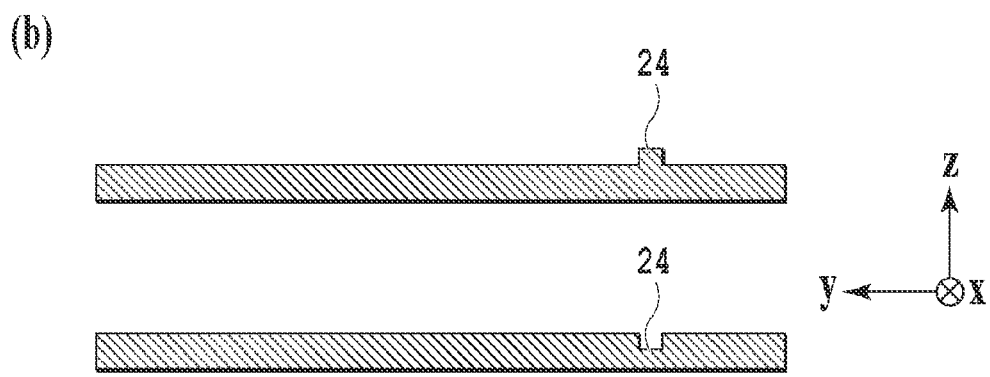

Next, referring to FIGS. 6(*a*) and 6(*b*), a semiconductor wafer alignment guide 24 that is a guide for determining the position of a semiconductor wafer to be placed on a semiconductor wafer carrier substrate 20 is described.

FIG. 6(*a*) is a diagram illustrating the semiconductor wafer carrier substrate 20 according to this embodiment. In a rim portion of the semiconductor wafer carrier substrate 20, or at positions corresponding to the outer periphery of the semiconductor wafer to be placed on the substrate, marks for determining a probe contact position are provided. The semiconductor wafer carrier substrate 20 has the semiconductor wafer alignment guide 24 at a position adjacent to at least part of the periphery of a predetermined semiconductor wafer position 23, and has at least one vacuuming hole 25 for securing the semiconductor wafer by vacuuming. Relative positions of the semiconductor wafer and the marks 22 that determines a probe contact position and is formed on the semiconductor wafer carrier substrate 20 are determined by the semiconductor wafer alignment guide 24 that is a mark for determining the predetermined semiconductor wafer position 23.

The semiconductor wafer alignment guide 24 is used to uniquely determine the predetermined semiconductor wafer position, and fix relative positions of the semiconductor wafer and the marks 22 for determining a probe contact position on the semiconductor wafer carrier substrate 20. In the example illustrated in FIG. 6(*a*), the semiconductor wafer alignment guide 24 having the same length as the length of the orientation flat of the semiconductor wafer is disposed at a position corresponding to the orientation flat of the semiconductor wafer on which the semiconductor wafer is placed. Thus, the upper and lower, and right and left positions of the predetermined semiconductor wafer position are determined. As illustrated in FIG. 6(*a*), there may be only one semiconductor wafer alignment guide 24 around the semiconductor wafer, as long as the predetermined semiconductor wafer position can be uniquely determined. As illustrated in FIG. 6(*b*), the semiconductor wafer alignment guide 24 may have a hole-like shape or a protruding shape. Particularly, in the case of a protruding shape, a semiconductor wafer is brought into contact with the protruding portion, so that its position in the vertical direction (the y-axis direction) is determined. Thus, alignment is facilitated. In a case where semiconductor wafer alignment guides 24 are provided above and below the semiconductor wafer to be placed as illustrated in FIGS. 3 and 4, alignment is also facilitated as long as the semiconductor wafer alignment guides have a protruding shape. Although a recessed shape and a protruding shape are illustrated in FIG. 6(*b*), the semiconductor wafer alignment guide 24 may be in a printed form or in a porous form, as long as the predetermined semiconductor wafer position 23 on the semiconductor wafer carrier substrate 20 can be uniquely determined.

With the semiconductor wafer carrier substrate 20 of this embodiment, it is possible to more easily determine the predetermined semiconductor wafer position 23 on the semiconductor wafer carrier substrate 20. A component of the semiconductor wafer carrier substrate 20 of this embodiment may replace a component of another embodiment or be added to the components of another embodiment.

Fourth Embodiment

Next, a case where a mark for determining a predetermined semiconductor wafer position 23 also serves as vacuuming holes is described with reference to FIG. 7.

Figure 7:
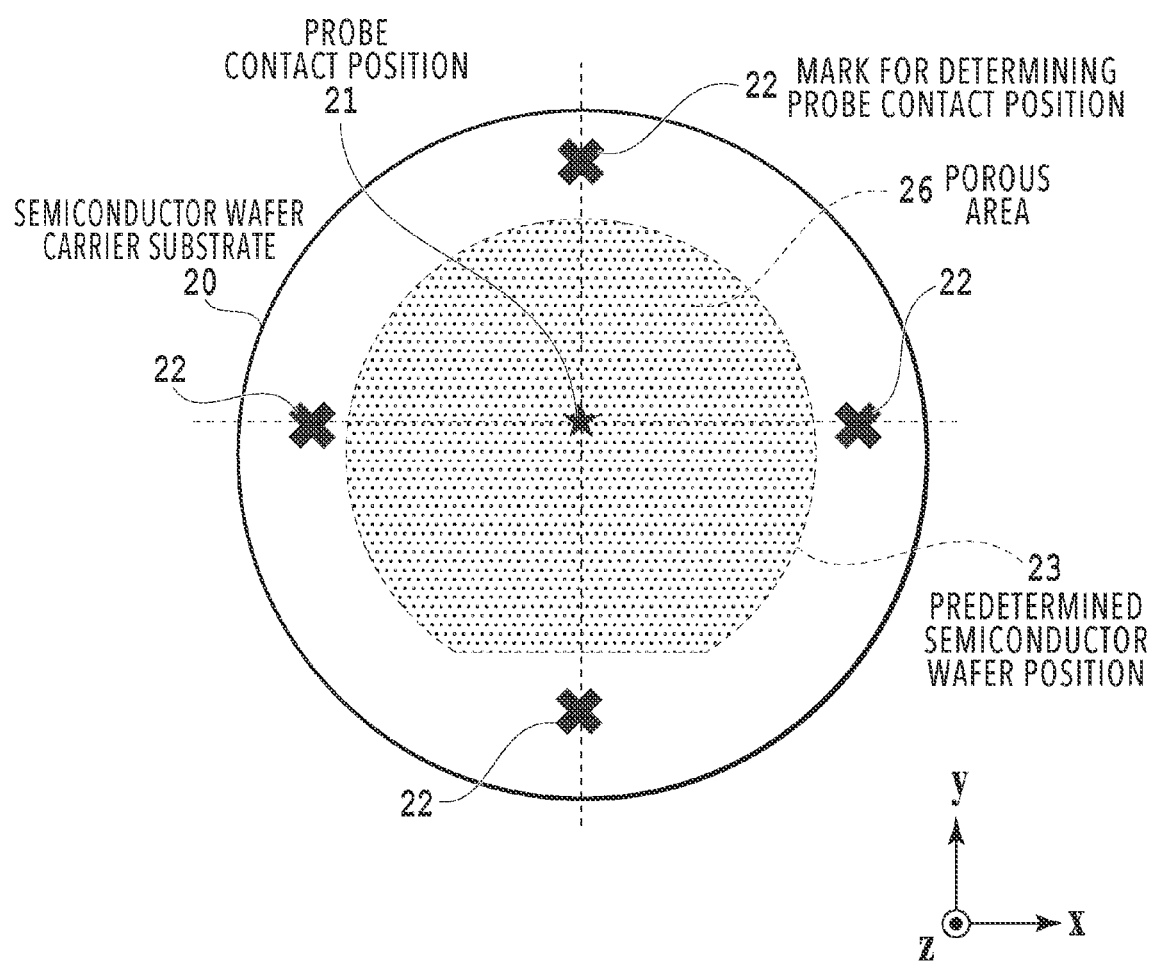
FIG. 7 is a diagram illustrating semiconductor wafer carrier substrate according to an embodiment of the present invention.

FIG. 7 is a diagram illustrating semiconductor wafer carrier substrate 20 according to this embodiment. A porous area 26 having the same size as the size of a semiconductor wafer to be placed is formed on the semiconductor wafer carrier substrate 20. In the porous area 26, a large number of vacuuming holes for securing a semiconductor wafer by vacuuming are arranged. In a rim portion of the semiconductor wafer carrier substrate 20, or at positions corresponding to the outer periphery of the semiconductor wafer to be placed on the substrate, marks 22 for determining a probe contact position are provided. The porous area 26 having the same size as the wafer size is formed as a semiconductor wafer alignment guide 24 that is a mark for determining a predetermined semiconductor wafer position. At least part of the large number of vacuuming holes in the porous area 26 is formed at a position adjacent to at least part of the periphery of the predetermined semiconductor wafer position 23, and thus, functions as a semiconductor wafer alignment guide 24 described in the other embodiments. Relative positions of the semiconductor wafer and the marks 22 that determine a probe contact position and are formed on the semiconductor wafer carrier substrate 20 are determined by this porous area 26.

As described above, with the use of the semiconductor wafer carrier substrate 20 on which the porous area 26 having the same size as the size of the semiconductor wafer to be placed is formed at the predetermined semiconductor wafer position 23, the semiconductor wafer can be positioned along the porous area 26, and furthermore, the semiconductor wafer can be secured by vacuuming. The vacuuming holes in the porous area 26 may not be formed in a uniform array in the entire porous area 26 as illustrated in FIG. 7, as long as a semiconductor wafer can be positioned and be secured by vacuuming. Further, the shape of the vacuuming holes may be circular, elliptical, or any other shape, as long as vacuuming can be performed.

With the semiconductor wafer carrier substrate 20 of this embodiment, relative positions of the semiconductor wafer and the marks 22 that determine a probe contact position and are formed on the semiconductor wafer carrier substrate 20 can be determined by a smaller amount of processing. A component of the semiconductor wafer carrier substrate 20 of this embodiment may replace a component of another embodiment or be added to the components of another embodiment. For example, the semiconductor wafer alignment guide 24 described with reference to FIG. 6 may be added to the semiconductor wafer carrier substrate 20 of this embodiment.

Fifth Embodiment

Next, a case where a semiconductor wafer carrier substrate 20 is manufactured with the use of a material that transmits infrared light and is used for optical devices for communication or the like is described.

Figure 8:
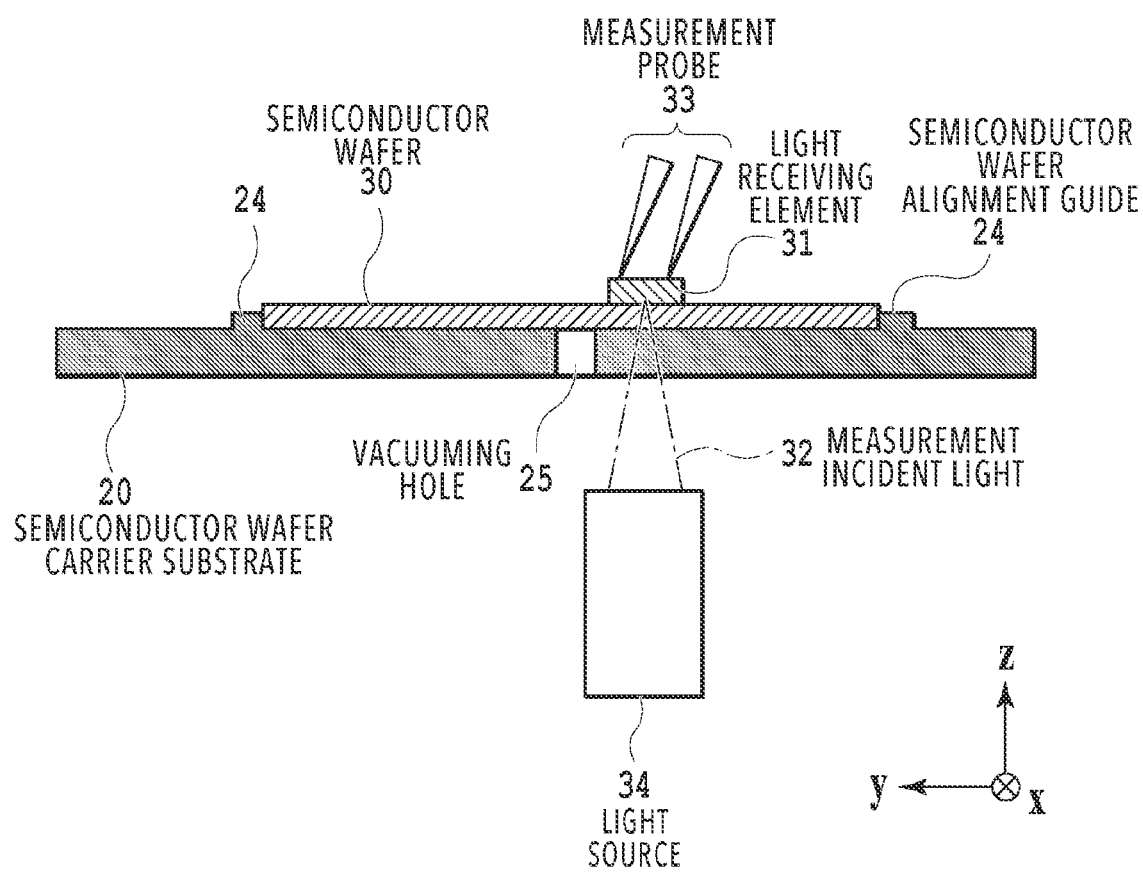
FIG. 8 is a diagram for explaining a semiconductor wafer carrier substrate according to an embodiment of the present invention.

FIG. 8 is a diagram illustrating a semiconductor wafer carrier substrate 20 according to a fifth embodiment. The semiconductor wafer carrier substrate 20 illustrated in FIG. 8 is a substrate manufactured with the use of a material that transmits infrared light. FIG. 8 also illustrates a semiconductor wafer 30 placed on the semiconductor wafer carrier substrate 20. FIG. 8 is a cross-sectional view taken along a direction (the x-axis direction) orthogonal to a direction (the z-axis direction) perpendicular to the principal surface of the semiconductor wafer carrier substrate 20. FIG. 8 illustrates a light source 34 for measurement incident light 32 on the back surface side of the semiconductor wafer carrier substrate 20, and also illustrates a measurement probe 33 on the front surface side of the semiconductor wafer carrier substrate 20. The semiconductor wafer carrier substrate 20 has a vacuuming hole 25 and semiconductor wafer alignment guides 24. In the x-y plane, the semiconductor wafer carrier substrate 20 has marks 22 (not illustrated) for determining a probe contact position. A light receiving element 31 having a structure for receiving light from the back surface of the semiconductor wafer 30 is formed on each shot of the semiconductor wafer 30 placed at a predetermined semiconductor wafer position 23 (not illustrated) on the semiconductor wafer carrier substrate 20. Electrical measurement not using light is carried out, with the probe being aligned by the method described in the above embodiments. After the electrical measurement not using light, the measurement incident light 32 enters from the back surface of the semiconductor wafer 20, without the semiconductor wafer 30 being moved from the semiconductor wafer carrier substrate 20. Light receiving characteristics are then evaluated with the measurement probe 33 electrically connected to the light receiving element 31.

With the semiconductor wafer carrier substrate 20 of this embodiment, it is possible to perform optical measurement of an optical device (such as the light receiving element 31) on the semiconductor wafer 30, without moving the semiconductor wafer 30 from the semiconductor wafer carrier substrate 20. As it is possible to start optical measurement of an optical device on the semiconductor wafer 30 while the semiconductor wafer 30 remains on the semiconductor wafer carrier substrate 20, the handling for movement from the semiconductor wafer carrier substrate 20 to a measurement system is facilitated, which can lead to an increase in measurement throughput and prevention of breakage. Examples of the material that transmits infrared light include Si, SiC, SiN, and sapphire, but any other material that transmits infrared light may be used.

Sixth Embodiment

Next, marks for determining a probe contact position are described with reference to FIG. 9.

Figure 9:
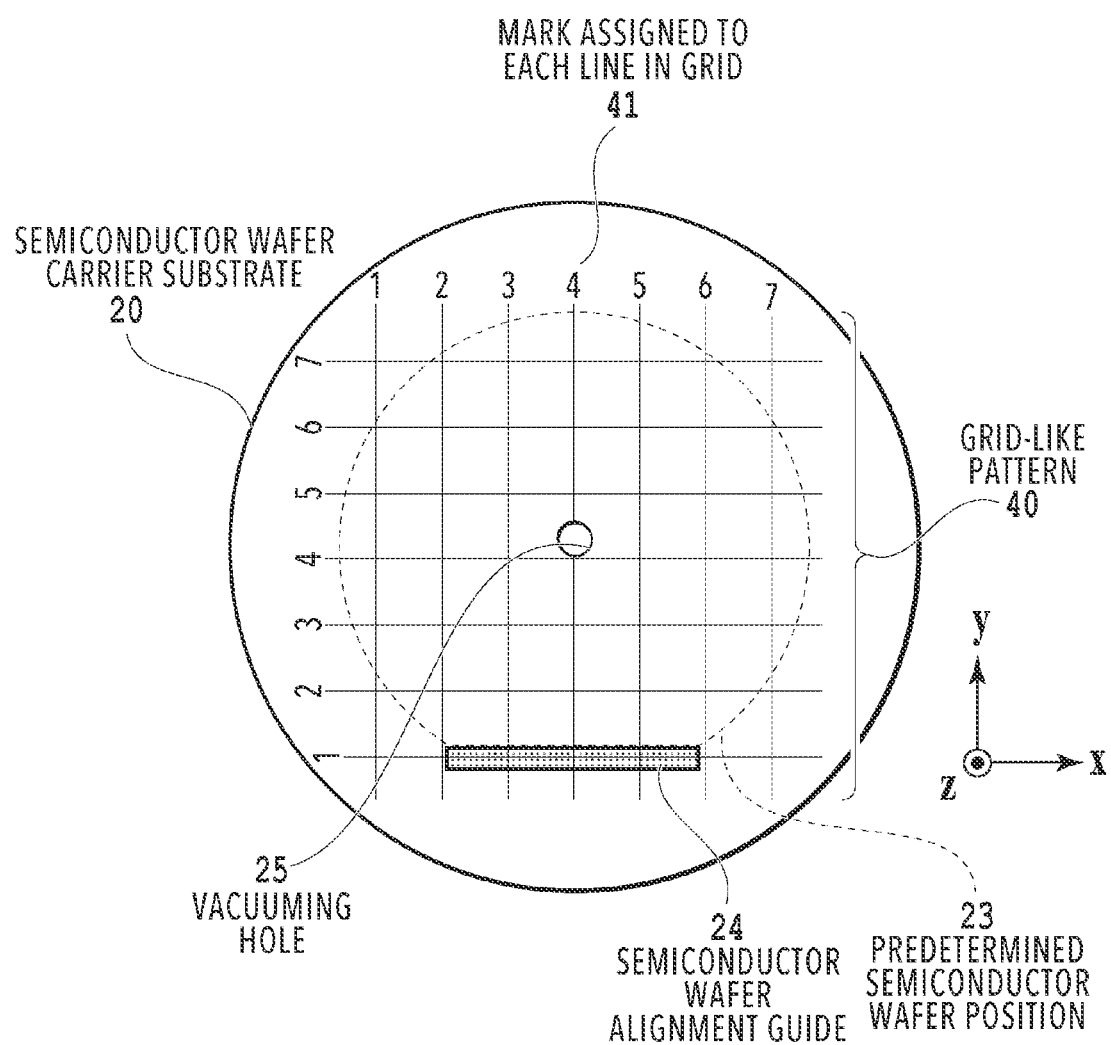
FIG. 9 is a diagram illustrating a semiconductor wafer carrier substrate according to an embodiment of the present invention.

FIG. 9 is a diagram illustrating a semiconductor wafer carrier substrate 20 according to a sixth embodiment. The semiconductor wafer carrier substrate 20 illustrated in FIG. 9 has a semiconductor wafer alignment guide 24 at a position adjacent to at least part of the periphery of a predetermined semiconductor wafer position 23, and has at least one vacuuming hole 25 for securing a semiconductor wafer by vacuuming. Relative positions of the semiconductor wafer and marks 41 (such as numbers described below) formed on the semiconductor wafer carrier substrate 20 are determined by the semiconductor wafer alignment guide 24 that is a mark for determining the predetermined semiconductor wafer position 23. On the semiconductor wafer carrier substrate 20, a grid-like pattern 40 is formed in a range that can cover an entire single conductor wafer. A mark 41 such as a number is assigned to each line in the grid-like pattern 40. By enabling identification of each line in the grid-like pattern 40 through visual recognition of the assigned mark 41 such as a number, it is possible to identify the current viewing position also from an image in not all of the semiconductor wafer carrier substrate 20 falls within the angle of view, and only a part thereof is shown. In a case where a probe contact position is determined with the use of such a semiconductor wafer carrier substrate 20, the probe contact position may be designated by numbers in the grid-like pattern 40. For example, the shot located at the intersection of horizontal line 6 and vertical line 3 is set as the probe contact position. If the grid-like pattern 40 is formed on the entire surface of the semiconductor wafer carrier substrate 20, and the marks 41 such as numbers are assigned to the respective lines in the grid-like pattern 40, it is possible to designate a probe contact position by changing the marks 41 such as numbers in the grid-like pattern 40 as necessary, using the same semiconductor wafer carrier substrate 20 for semiconductor wafers that have the same inch but have different probe contact positions.

The marks 41 are not necessarily numbers or the like, as long as each line in the grid-like pattern 40 can be identified. Even the type of the lines in the grid-like pattern 40 may be changed. Types of lines may be used as the marks 41, as long as each line can be distinguished from each adjacent line. For example, a bold line, a dotted line, or a double line may be arranged in this order. Only the edge portions of each line in the grid-like pattern 40 may be changed in type.

Since shots are basically arranged in parallel or perpendicular to the orientation flat of the semiconductor substrate, it is convenient that the respective lines in the grid-like pattern 40 is basically parallel or perpendicular to the orientation flat. However, the respective lines in the grid-like pattern 40 are not necessarily parallel or perpendicular to the orientation flat, as long as the shots can be identified.

With the semiconductor wafer carrier substrate 20 of this embodiment, any shot that can be designated by the corresponding lines in the grid-like pattern 40 on a semiconductor wafer can be designated as a probe contact position.

The invention claimed is:

1. A wafer carrier substrate for carrying a wafer on which a plurality of chips is formed, an element to be measured being formed in the plurality of chips,
   the wafer carrier substrate comprising:
   a vacuuming hole for vacuuming of the wafer placed on the wafer carrier substrate;
   a wafer alignment guide that determines a predetermined position of the wafer placed on the wafer carrier substrate; and
   a mark that determines a probe contact position;
   wherein the mark that determines the probe contact position enables identification of each line in a grid-like pattern on the wafer carrier substrate.

2. The wafer carrier substrate according to claim 1, further comprising two or more marks that determine the probe contact position.

3. The wafer carrier substrate according to claim 1, wherein a size of the mark is 100 μm or greater and 1 mm or shorter in both length and width, the mark determining the probe contact position.

4. The wafer carrier substrate according to claim 1, wherein the wafer alignment guide is a protruding portion with respect to the wafer carrier substrate.

5. The wafer carrier substrate according to claim 1, wherein the vacuuming hole functions as the wafer alignment guide.

6. The wafer carrier substrate according to claim 1, wherein the wafer carrier substrate is formed with a material that transmits infrared light.

7. A wafer carrier substrate for carrying a wafer on which a plurality of chips is formed, an element to be measured being formed in the plurality of chips,
   the wafer carrier substrate comprising:
   a vacuuming hole for vacuuming of the wafer placed on the wafer carrier substrate;
   a wafer alignment guide that determines a predetermined position of the wafer placed on the wafer carrier substrate; and
   a mark that determines a probe contact position;

wherein the mark that determines the probe contact position is each line in a grid-like pattern on the wafer carrier substrate, and at least some of the respective lines are drawn by lines of types distinguishable from one another.

8. The wafer carrier substrate according to claim 7, further comprising two or more marks that determine the probe contact position.

9. The wafer carrier substrate according to claim 7, wherein a size of the mark is 100 µm or greater and 1 mm or shorter in both length and width, the mark determining the probe contact position.

10. The wafer carrier substrate according to claim 7, wherein the wafer alignment guide is a protruding portion with respect to the wafer carrier substrate.

11. The wafer carrier substrate according to claim 7, wherein the vacuuming hole functions as the wafer alignment guide.

12. The wafer carrier substrate according to claim 7, wherein the wafer carrier substrate is formed with a material that transmits infrared light.

* * * * *